US012044585B1

(12) United States Patent
Okojie

(10) Patent No.: US 12,044,585 B1
(45) Date of Patent: Jul. 23, 2024

(54) ON-CHIP INTEGRATED SILICON CARBIDE PRESSURE AND TEMPERATURE SENSORS

(71) Applicant: United States of America as represented by the Administrator of NASA, Washington, DC (US)

(72) Inventor: Robert S. Okojie, Cleveland, OH (US)

(73) Assignee: United States Government Administrator of NASA, Washington, DC (US)

( * ) Notice: Subject to any disclaimer, the term of this patent is extended or adjusted under 35 U.S.C. 154(b) by 484 days.

(21) Appl. No.: 17/320,719

(22) Filed: May 14, 2021

Related U.S. Application Data

(60) Provisional application No. 63/025,307, filed on May 15, 2020.

(51) Int. Cl.
| | |
|---|---|
| *G01L 19/00* | (2006.01) |
| *B81B 7/00* | (2006.01) |
| *B81C 1/00* | (2006.01) |
| *G01K 7/16* | (2006.01) |
| *G01L 9/06* | (2006.01) |
| *H01L 29/66* | (2006.01) |

(52) U.S. Cl.
CPC ........ *G01L 19/0092* (2013.01); *B81B 7/0035* (2013.01); *B81C 1/00158* (2013.01); *G01K 7/16* (2013.01); *G01L 9/06* (2013.01); *H01L 29/66053* (2013.01); *B81B 2201/0264* (2013.01); *B81B 2201/0278* (2013.01); *B81C 2201/0132* (2013.01); *B81C 2201/0156* (2013.01); *B81C 2201/0197* (2013.01)

(58) Field of Classification Search
CPC ..... G01L 19/0092; G01L 9/06; B81B 7/0035; B81B 2201/0264; B81B 2201/0278; B81C 1/00158; B81C 2201/0132; B81C 2201/0156; B81C 2201/0197; G01K 7/16; H01L 29/66053
See application file for complete search history.

(56) References Cited

U.S. PATENT DOCUMENTS

| | | | |
|---|---|---|---|
| 6,706,549 B1 * | 3/2004 | Okojie ............... | B81C 1/00182 257/417 |
| 2014/0291677 A1 * | 10/2014 | Le Neel ................. | H01L 25/50 438/49 |
| 2016/0135749 A1 * | 5/2016 | Chan .................... | A61B 5/0031 600/301 |
| 2016/0266061 A1 * | 9/2016 | Yu ........................ | G01L 9/0073 |

FOREIGN PATENT DOCUMENTS

KR  20050063097 A  *  6/2005

OTHER PUBLICATIONS

Machine translation of KR20050063097 (with original document) (Year: 2005).*

* cited by examiner

*Primary Examiner* — Shahed Ahmed
*Assistant Examiner* — Sun Mi Kim King
(74) *Attorney, Agent, or Firm* — Robert H. Earp, III; Mark Wolfgang; Trenton J. Roche

(57) ABSTRACT

An integration of silicon carbide (SiC) pressure sensor and a temperature sensor on a single SiC substrate to facilitate the simultaneous measurement of pressure and temperature at temperature, and a method of fabricating the same.

17 Claims, 10 Drawing Sheets

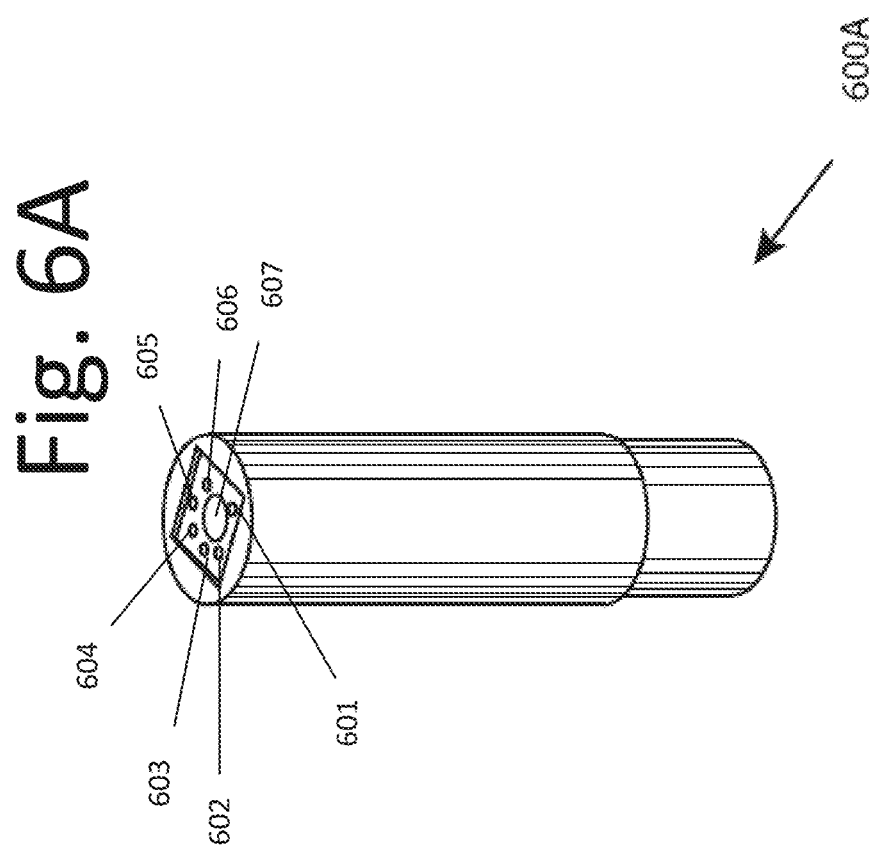

600D

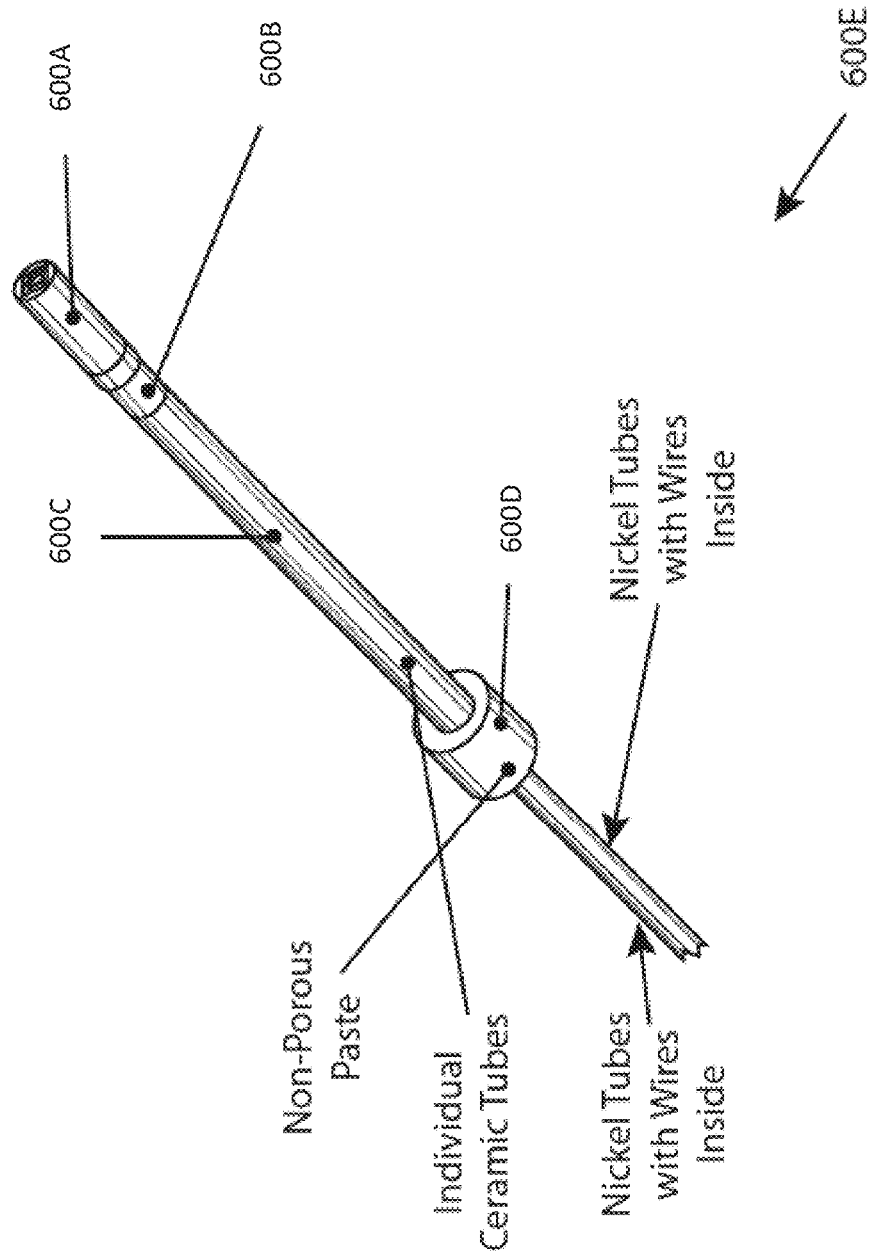

ON-CHIP INTEGRATED SILICON CARBIDE PRESSURE AND TEMPERATURE SENSORS

CROSS-REFERENCE TO RELATED APPLICATION

This application claims the benefit of U.S. Provisional Patent Application No. 63/025,307 filed May 15, 2020. The subject matter of this earlier filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to sensors, and more particularly, to on-chip integrated silicon carbide (SiC) pressure and temperature sensors to facilitate the simultaneous measurement of pressure and temperature at temperature.

BACKGROUND

Pressure sensing in aero-engine combustion chambers is becoming of increased importance for the experimental validation of computational fluid dynamics (CFD) codes used in engine model predictions. Currently, there is high uncertainties in CFD codes, more pronounced in the high temperature regime of model prediction.

Experimental validation of CFD codes is necessary in order to improve their accuracy, thereby reducing the existing high level of uncertainties. It is also desirable to monitor in real-time low magnitude pressure transients that manifest the onset of thermoacoustic instabilities and mitigate their growth in order to prevent damage to critical engine components. The above stated needs are currently addressed with state of the art pressure transducers that are traditionally placed several feet away from the combustion chamber to prevent sensor damage while pressure is transmitted through semi-infinite tubes to the transducers.

However, the tube length and distortions in its geometry could result in acoustic reflections and/or attenuation that could lead to the loss of key frequency components or distortion.

SiC pressure sensors have been developed and demonstrated to operate at 800° C., allowing the sensor to be inserted in close proximity to the combustion chamber. However, the output response of piezoresistive based pressure sensors is sensitive to changes in temperature during pressure measurement. It, therefore, requires temperature compensation techniques that would subtract the temperature sensing component and preserve the measured pressure. Of equal importance as the pressure sensor is the temperature sensor. Pressure and temperature measurements are critical for the validation of the CFD codes and for the monitoring of engine health during flight.

The traditional approach to sensing these two events is to insert each transducer into separate borescopes in the test article, and effort would be made to locate them in close proximity as practically possible. It is known that best pressure temperature correlation is obtained when the two transducers are located as closely together as possible. In doing so, the effect of temperature on the pressure sensor would be effectively and accurately quantified so that the temperature compensation strategy that is implemented would be trusted. The state of the art approach of having separate pressure and temperature transducers does not provide for such accurate translation of the temperature effect on the pressure sensor. This is because the two sensors are not located on the same chip and taps must be inserted further into the test article where temperature is as high as 800° C. Attempts to insert taps into such high temperature environment results in the destruction of the pressure sensor. There is a general reluctance on the part of engine manufacturers to have too many pressure and temperature taps than is necessary in the engine. That is why the use of a common tap for both pressure and temperature measurement is preferred. Real-time translation of pressure as function of temperature is needed in order to provide instantaneous pressure signals as the test progresses. Significant cost reduction in production and assembly is achieved, and eases path toward IC integration. Buying the pressure and temperature sensors separately is more expensive than the integration of both on a single chip.

Accordingly, an improved pressure and temperature sensor system may be beneficial.

SUMMARY

Certain embodiments of the present invention may be implemented and provide solutions to the problems and needs in the art that have not yet been fully solved by conventional pressure and temperature sensor technologies. For example, some embodiments of the present invention pertain to the integration of SiC pressure sensor and temperature sensor on a single SiC substrate to facilitate the simultaneous measurement of pressure and temperature at temperature.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 6A is a diagram illustrating a sensor bearing surface mounted header, according to an embodiment of the present invention.

FIG. 6E is a diagram illustrating a final package assembly, according to an embodiment of the present invention.

Unless otherwise indicated, similar reference characters denote corresponding features consistently throughout the attached drawings.

DETAILED DESCRIPTION OF THE EMBODIMENTS

Some embodiments of the present invention pertain to the integration of SiC pressure sensor and temperature sensor on a single SiC substrate to facilitate the simultaneous measurement of pressure and temperature at temperature.

Figure 1:
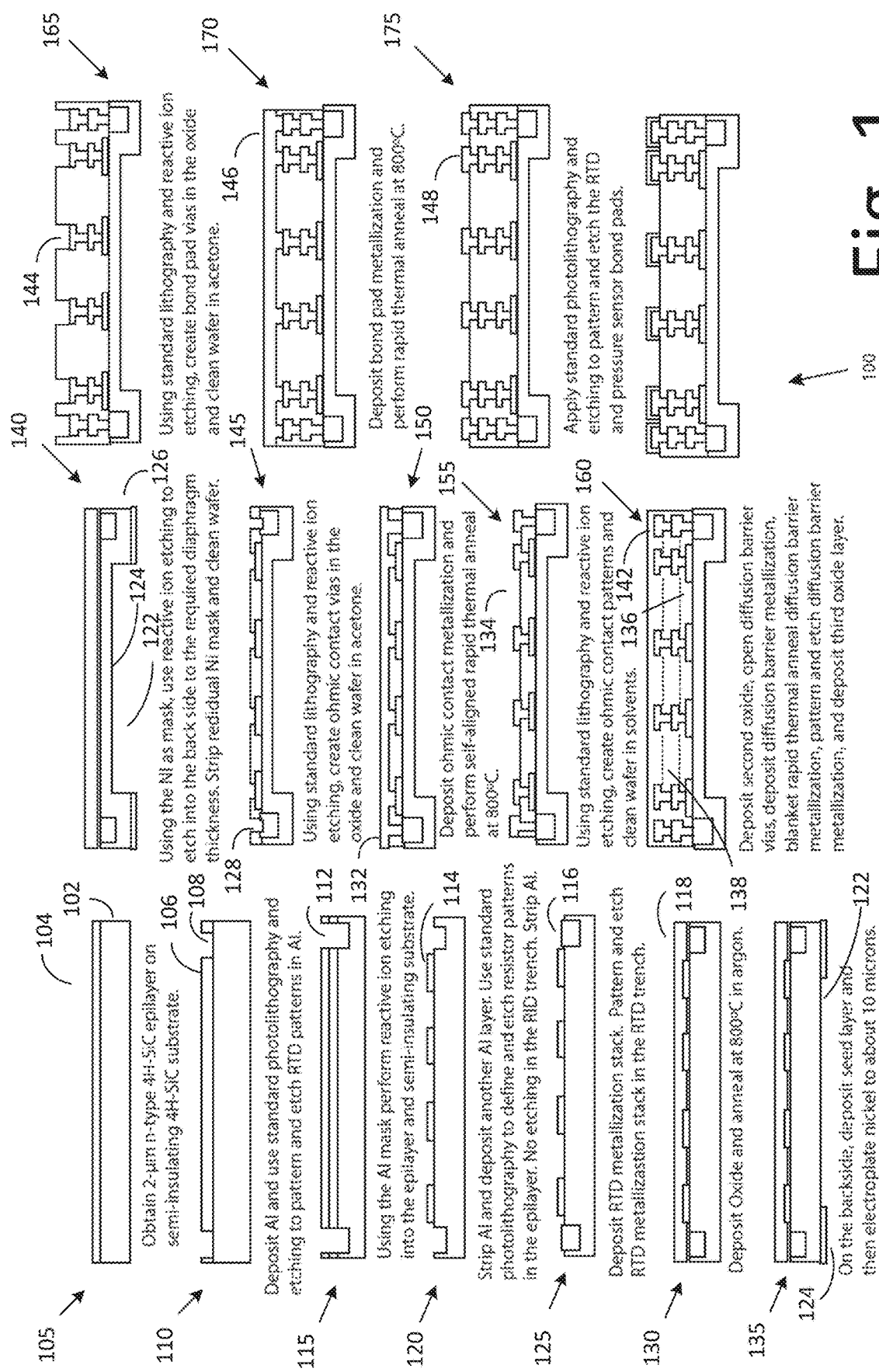
FIG. 1 is a flow diagram illustrating a method for fabricating an integrated pressure sensor and temperature sensor on a single SiC substrate (embedded resistor thermal detector), according to an embodiment of the present invention.

FIG. 1 is a flow diagram illustrating a method for fabricating an integrated pressure sensor and temperature sensor on a single SiC substrate (or embedded resistor thermal detector (RTD)), according to an embodiment of the present invention. In some embodiments, method 100 begins with obtaining 2-μm n-type 4H-SiC epilayer 102 on semi-insulating 4H-SiC substrate 104 at 105. At 110, aluminum (Al) 106 is deposited on the 4H-SiC epilayer 102, and standard photolithography is used to etch trench patterns 108 in the Al.

At 115, method 100 uses the Al mask 106 to perform reactive ion etching into the epilayer 102 and semi-insulating substrate 104 to realize the trench 112, which in the present embodiment has a serpentine structure. At 120, the Al 106 is stripped and another Al layer 114 is deposited. For this, a standard photolithography is used to define and etch resistor patterns in the epilayer. Note, there is no further etching in the RTD trench 112 and the Al is stripped.

At 125, RTD metallization stack 116 comprising of $TaSi_2$ (1 micron)/Pt (5 microns)/$TaSi_2$ (1 micron) is deposited into the serpentine trench and on the surface of the wafer. In this step, the RTD metallization stack 116 is patterned and etched in the RTD trench 112. An alternative to this step is to deposit the metallization stack 116 into the serpentine trench through a shadow mask. At 130, oxide 118 is deposited onto the RTD metallization stack 116 and is annealed at 800° C. in argon.

At 135, on the backside 122 of the RTD metallization stack, a nickel (Ni) seed layer is deposited and then the nickel (Ni) is electroplated to about 10 microns to form a nickel mask 124. At 140, using the nickel (Ni) mask 124, use reactive ion etching to etch into the backside 122 to form a diaphragm with a required diaphragm thickness 126. Residual Ni mask 124 is striped and the wafer is cleaned.

At 145, using standard lithography and reactive ion etching, ohmic contacts 128 are created in the oxide. The wafer is then cleaned in acetone. At 150, ohmic contact metallization of Ti (100 nm)/$TaSi_2$ (300 nm)/Ti (100 nm)/Pt (300 nm) is deposited and self-aligned rapid thermal anneal is performed at 800° C. Another layer 132 of Ti (100 nm)/Pt (300 nm) is deposited and annealed at 800° C. At 155, using standard lithography and reactive ion etching, ohmic contact patterns 134 are created and wafer is cleaned in solvents. At 160, a second oxide 136 is deposited, diffusion barrier vias are opened, diffusion barrier metallization of Ti (100 nm)/Pt (300 nm) is deposited, blanket rapid thermal annealed at 800° C., followed by another layer 138 of Ti (20 nm)/$TaSi_2$ (20 nm)/Pt (100 nm)/Au (1 micron) and anneal at 800° C. The diffusion barrier metallization is then patterned and etched by reactive ion etching, followed by deposition of a third oxide layer 142.

At 165, using standard lithography and reactive ion etching, bond pad vias 144 are created in the oxide and the wafer is cleaned in acetone. At 170, bond pad metallization 146 is deposited and a rapid thermal anneal is performed at 800° C., and at 175, standard photolithography and etching is applied to the pattern, and the RTD and pressure sensor bond pads 148 are etched.

Figure 2:
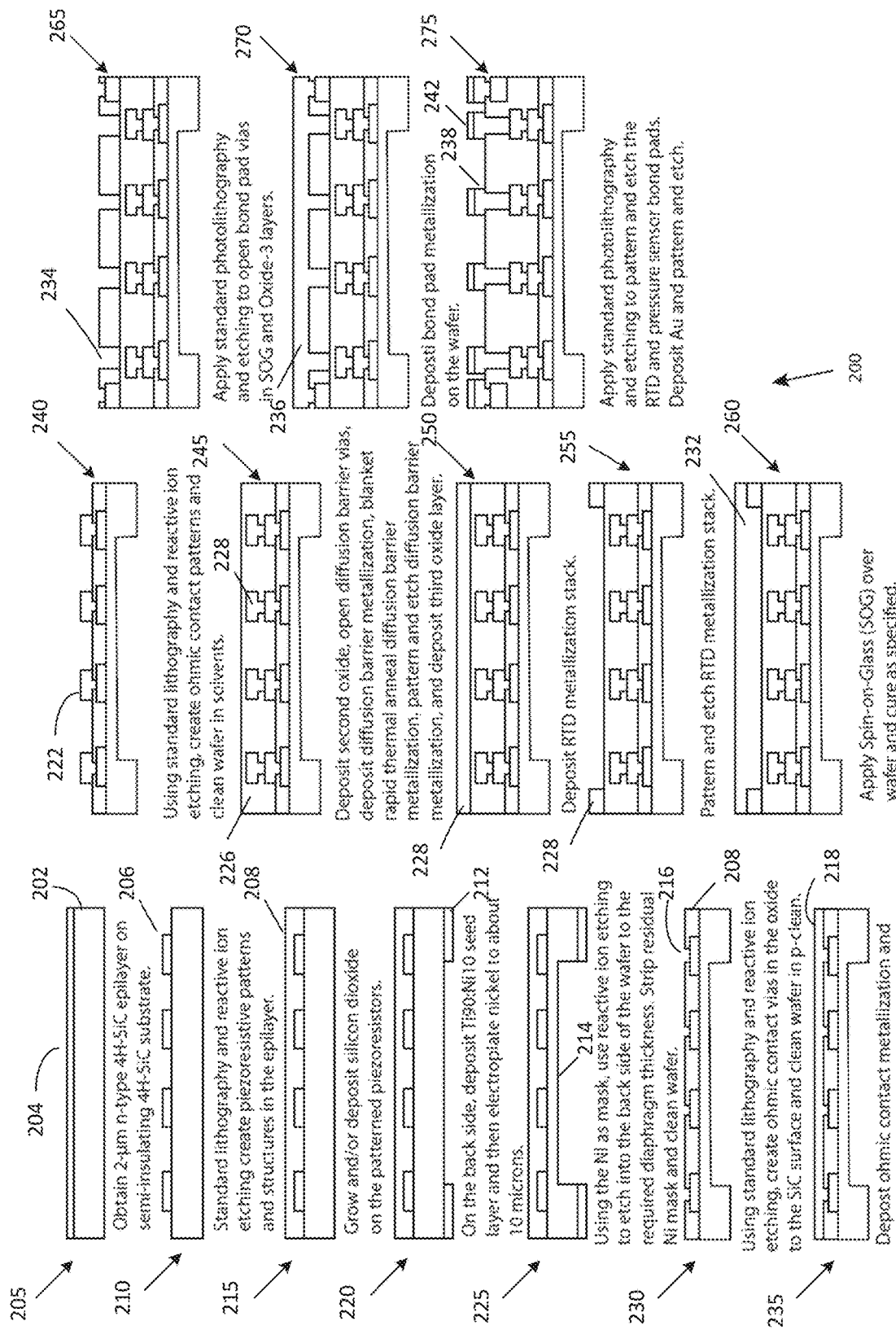
FIG. 2 is a flow diagram illustrating a method for fabricating an integrated pressure sensor and temperature sensor on a single SiC substrate (surface resistor thermal detector), according to an embodiment of the present invention.

FIG. 2 is a flow diagram illustrating a method for fabricating an integrated pressure sensor and temperature sensor on a single SiC substrate (surface resistor thermal detector), according to an embodiment of the present invention. In some embodiments, method 200 begins with obtaining 2-μm n-type 4H-SiC epilayer 202 on semi-insulating 4H-SiC substrate 204 at 205. At 215, standard lithography and reactive ion etching is used to create piezoresistive patterns and structures 206 in the epilayer 202.

At 215, silicon dioxide 208 is grown or deposited on the patterned piezoresistors. At 220, on the backside, Ti90:Ni10 seed layer is deposited and then nickel (Ni) 212 is electroplated to about 10 microns.

At 225, using nickel (Ni) as a mask 212, reactive ion etching is used to etch onto the backside 214 of the wafer to a desired diaphragm thickness. In this step, residual nickel (Ni) is stripped and the wafer is cleaned. At 230, using standard lithography and reactive ion etching, ohmic contact vias 216 are created in the oxide 208 to SiC surface and the wafer is cleaned in piranha clean (p-clean), which is equal volume of hydrogen peroxide and sulfuric acid.

At 235, ohmic contact metallization 218 (as described in 150) is deposited and self-aligned thermal anneal is performed at 800° C. At 240, using standard lithography and reactive ion etching, ohmic contact patterns 222 are created and the wafer is cleansed in an acetone and isopropanol solvents.

At 245, deposit a second oxide 224, open diffusion barrier vias, deposit diffusion barrier metallization 226 (as described in 160), blanket rapid thermal anneal diffusion barrier metallization, pattern and etch diffusion barrier metallization, and deposit third oxide layer. At 250, RTD metallization stack 228 is deposited. At 255, the RTD metallization stack 228 is patterned and etched. At 260, a spin-on-glass (SOG) 232 is applied over wafer and cured.

At 265, standard photolithography and etching is applied to open bond pad vias 234 in SOG and oxide-3 layers. At 270, a bond pad metallization 236 is deposited on the wafer, and at 275, apply standard photolithography and etching to pattern and etch the RTD and pressure sensor bond pads 238. Finally, gold (Au) 242 is deposited followed by pattern and etching.

Figure 3:
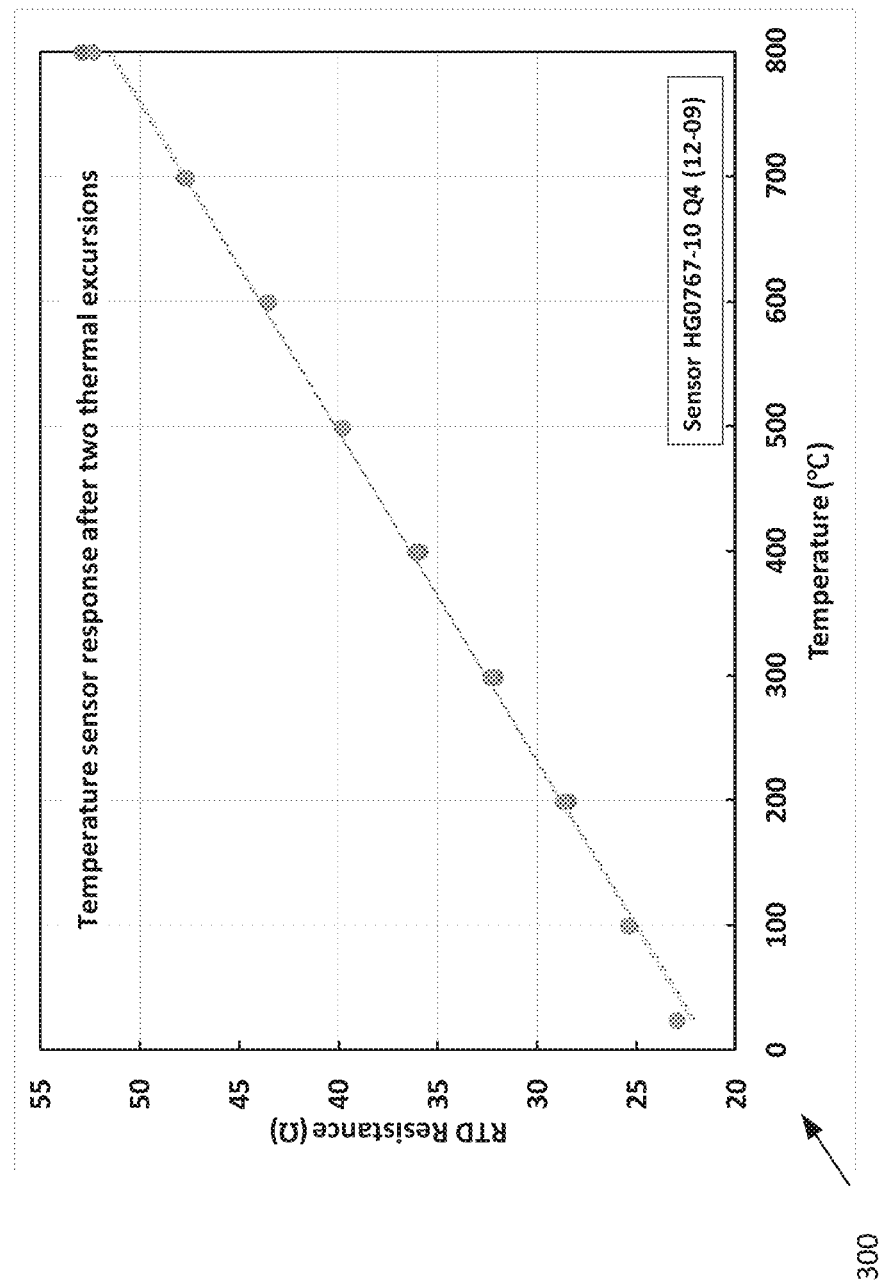
FIG. 3 illustrates graphs showing temperature sensor response after two thermal excursions, according to an embodiment of the present invention.

FIG. 3 illustrates a graph 300 showing temperature sensor response after two thermal excursions, according to an embodiment of the present invention.

In the example shown in graph 300, the RTD was placed in an atmospheric oven and heated to 800° C. Also placed in the oven was a k-type calibrated thermocouple for reference. Temperature was then gradually raised at increments and held for 10 minutes. This was repeated at each increment up to 800° C. The process was repeated during the cooling down cycle.

Figure 4:
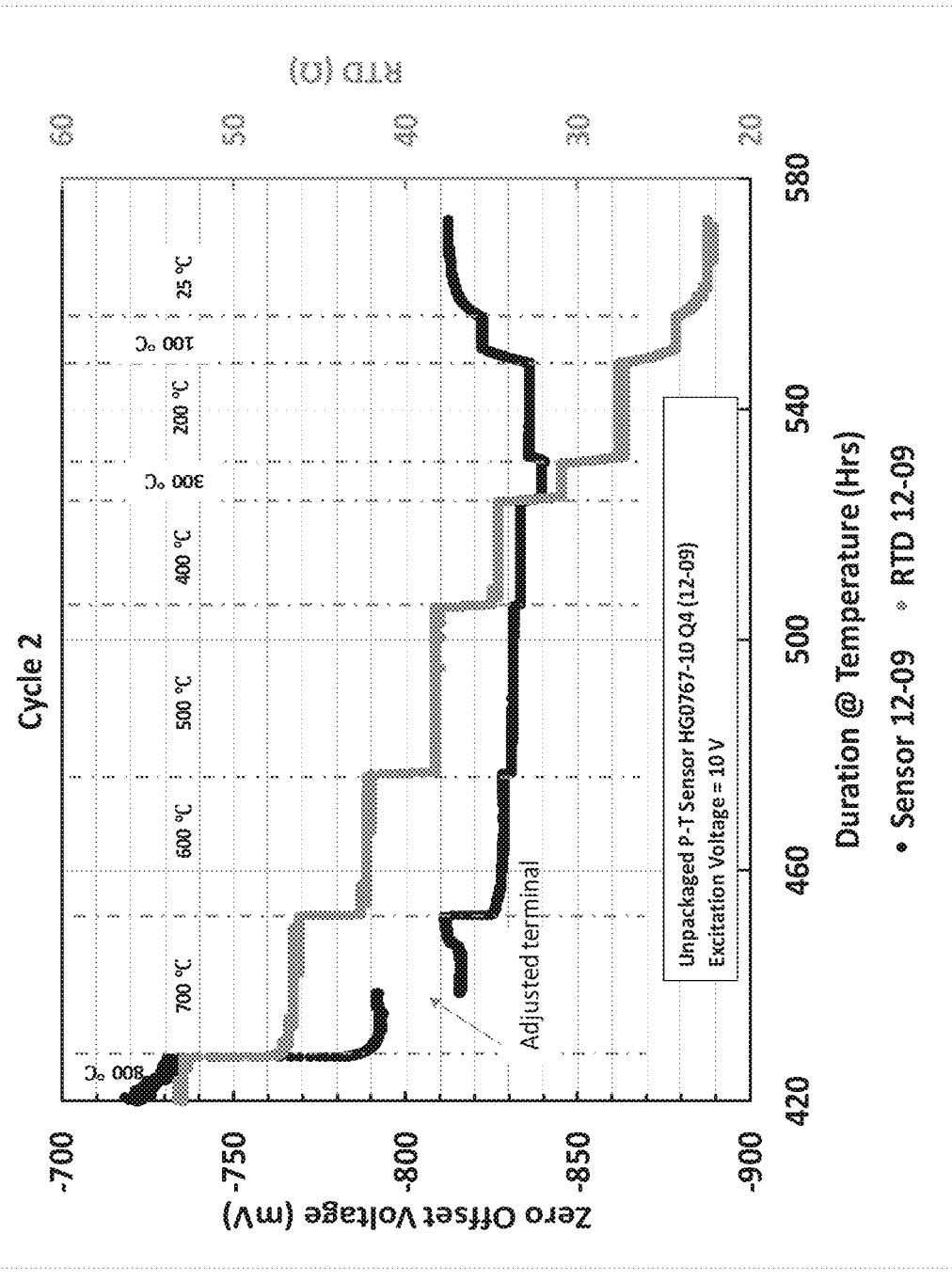
FIG. 4 illustrates a graph showing simultaneous measurement of temperature and zero pressure output voltage of an integrated device at different temperatures, according to an embodiment of the present invention.

FIG. 4 illustrates a graph 400 showing simultaneous measurement of temperature and zero pressure output voltage of an integrated device at different temperatures, according to an embodiment of the present invention. In this embodiment, graph 400 shows how the temperature affects the zero pressure output voltage and how the co-located temperature sensors provides accurate measurement of the temperature. By quantifying the relationship between the temperature and the zero pressure output, an effective temperature compensation scheme can be implemented.

Figure 5:
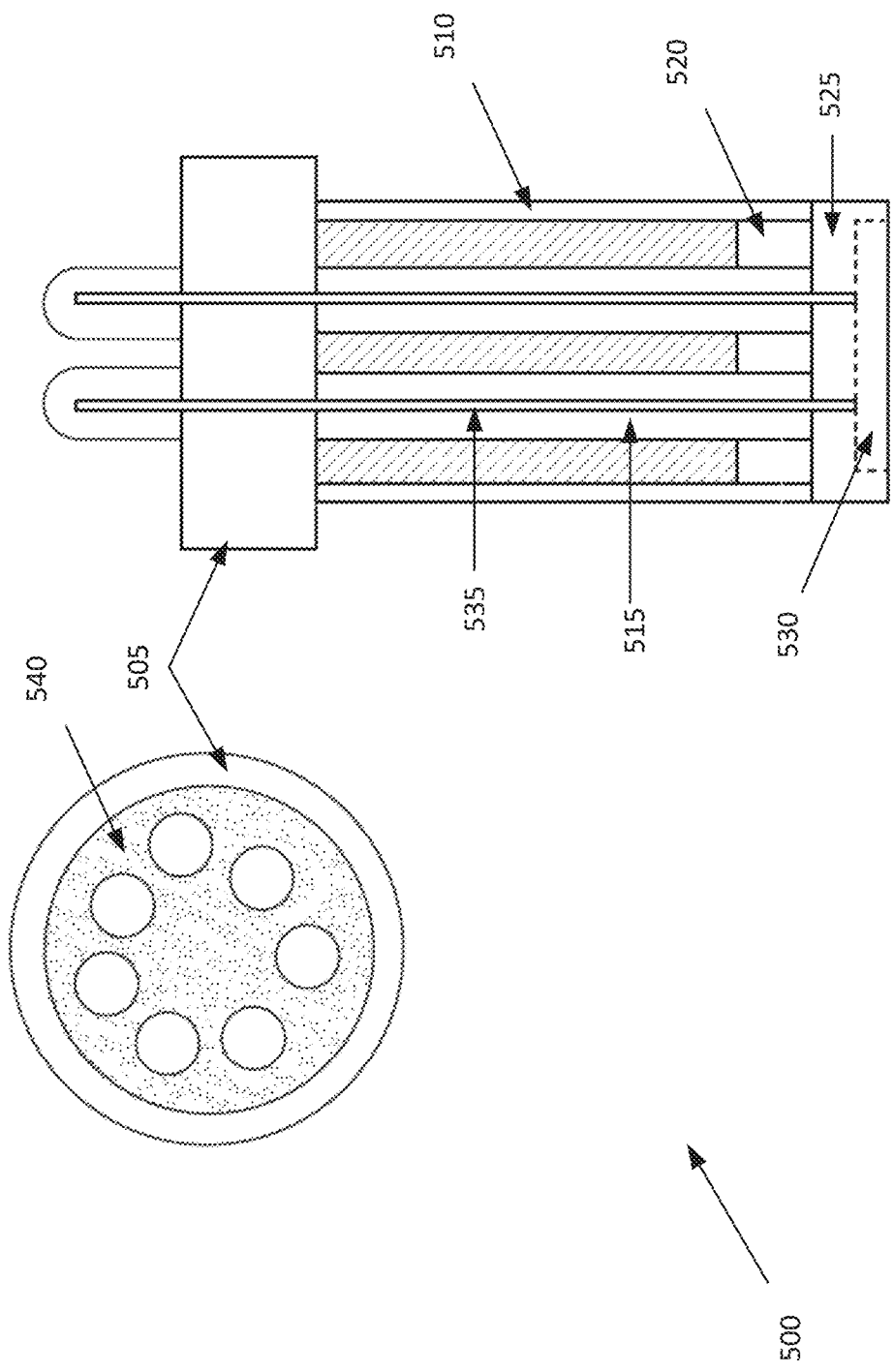
FIG. 5 is a diagram illustrating a backend packaging for an integrated pressure sensor and temperature sensor on a single SiC substrate, according to an embodiment of the present invention.

FIG. 5 is a diagram illustrating a cross sectional view of a backend packaging 500 for an integrated pressure sensor and temperature sensor on a single SiC substrate, according to an embodiment of the present invention. In some embodiments, backend packaging 500 includes a dam 505 composed of nickel (Ni), which is welded to an alloy tube 510 to prevent leaks. The alloy tube 510 may be any suitable alloy such as an iron-Nickel-Cobalt alloy. Commercially available alloy tubes include tubes sold under the trademark KOVAR. A nickel (Ni) tube 515 is closed at the top to also prevent leaks. Ni tube 515 may extend into aluminum nitride (MN) shoulder 520.

Non-porous dielectric material (or fill) 540 is hermetically attached to nickel (Ni) tubes 515 and nickel (Ni) dam 505. It should be noted that any metal material may be used to prevent leaks between nickel (Ni) tubes 515 and non-porous dielectric material 540. A pair of gold (Au) wires 535 extending across the length of nickel (Ni) tubes 515 extend into AIN header 525. Wires 535 may breach through AIN header 525 and extend into sensor 530.

In some embodiments, dam 505 and alloy tube 510 are seal welded. These seal welds prevent leakage from any joints starting from the tip of the sensor.

The package may be composed of four structural components. For example, the structural components may include a sensor bearing surface mounted header, surface mounted header adapter, alloy tube, and a stainless-steel dam. FIG. 6A is a diagram illustrating a sensor bearing surface mounted header 600A, according to an embodiment of the present invention. Header 600A may receive an integrated pressure and temperature sensors chip. There are seven through holes 601-607 that receive wires that connect to the integrated pressure and temperature sensors chip. Two of the seven holes are dedicated for the RTD while the remaining five holes are for the pressure sensor. The wires (not shown) make contact with the contact pads of the chip and then extend through the holes to the external back end of the package.

Figure 6B:
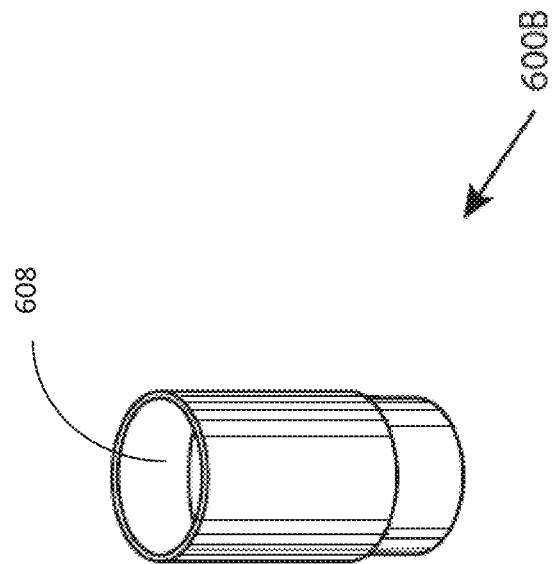
FIG. 6B is a diagram illustrating a surface mounted header adapter, according to an embodiment of the present invention.

FIG. 6B is a diagram illustrating a surface mounted header adapter 600B, according to an embodiment of the present invention. In some embodiments, the narrow neck of header 600A of FIG. 6A slides into the receptacle 608 of adapter 600B. A high temperature glass paste may be applied to the narrow neck of header 600A before it is slid into adapter 600B. The glass paste is then cured at 800° C. in atmosphere for 15 minutes. This process results in the sealing of the joint between header 600A and adapter 600N, thereby preventing leaks.

The wires (not shown) that are connected to the chip on header 600A, which pass through the seven holes that are also in adapter 600B. These holes in adapter 600B may align with the seven holes in header 600A.

Figure 6C:
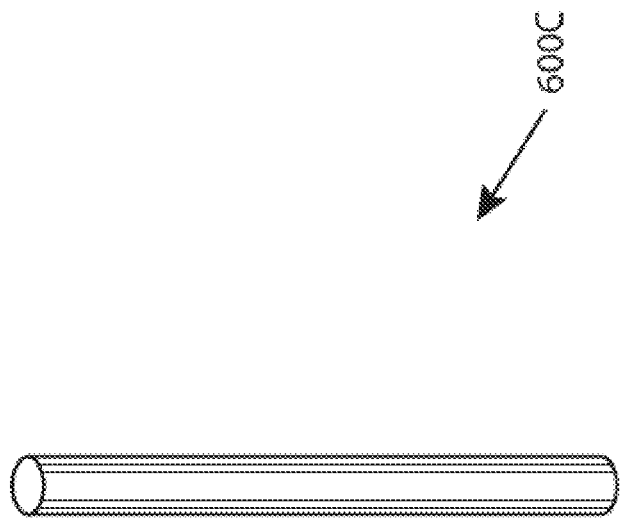
FIG. 6C is a diagram illustrating an alloy tube, according to an embodiment of the present invention.

FIG. 6C is a diagram illustrating an alloy tube 600C, according to an embodiment of the present invention. The smaller outer dimension neck of adapter 600B slides into alloy tube 600C and is then brazed with a high temperature braze alloy at 800° C. for up to 15 minutes. The brazed joint between the ceramic AIN adapter and the metallic alloy tube is brazed to ensure that no leak occurs.

Figure 6D:
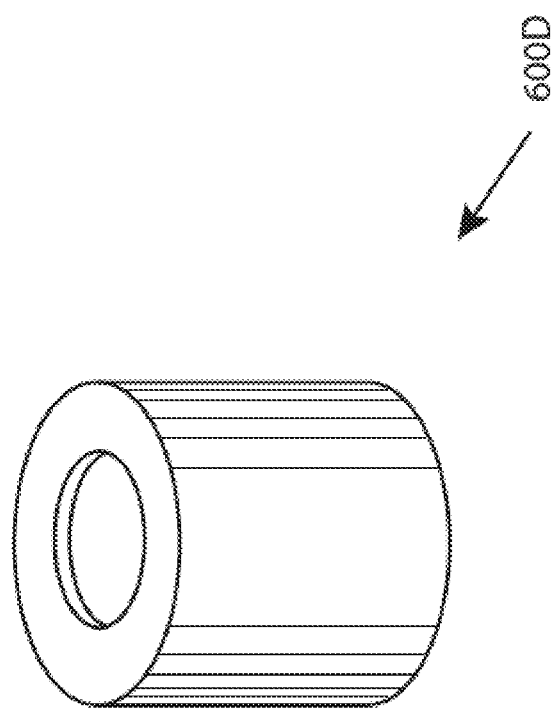
FIG. 6D is a diagram illustrating a stainless steel dam, according to an embodiment of the present invention.

FIG. 6D is a diagram illustrating a stainless steel dam 600D, according to an embodiment of the present invention. In some embodiments, dam 600D receives the other end of alloy tube 600C. Alloy tube 600C is partially inserted into the hole made through the dam. The outer diameter surface of Alloy tube 600C makes contact with dam 600D. In some embodiments dam 600D is subsequently seal welded to prevent leaks.

FIG. 6E is a diagram illustrating a final package assembly 600E, according to an embodiment of the present invention. In this embodiment, the wires (not shown) that are in contact with the chip extend through the above components shown in final package assembly 600E. In order to prevent the wires from breakage, they are individually inserted through small tubes of nickel. Each nickel tube is slid into each hole of header 600A, through adapter 600B, through alloy tube 600C, through dam 600D, and to the outside. To prevent the nickel tube (with wire inside) from touching each other and causing electrical shorts (nickel being an electrical conductor), each individually inserted into small ceramic tubes. These ceramic tubes, just like the nickel tube, extend from the holes inside header 600A, through the holes inside adapter 600B, through alloy tube 600C, and terminate halfway inside dam 600D. Dam 600D is filled with a ceramic paste and cured at high temperature to create a non-porous solid filling, thereby rigidly holding the spread out nickel tubes (wire inside each), rigidly holding the small ceramic tube sheaths (wire and nickel inside each), and rigidly attached to the inner wall of dam 600D. The only parts sticking out of dam 600D are the nickel tubes, each with a corresponding wire to facilitate external electrical connection. This allows the measurement of pressure and temperature to be performed.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method for fabricating an integrated pressure sensor and temperature sensor on a single silicon carbide (SiC) substrate, comprising:
   obtaining an n-type 4H-SiC epilayer on semi-insulating 4H-SiC substrate;
   depositing aluminum on the 4H-SiC epilayer;
   performing reactive ion etching, by using an aluminum mask, into the 4H-SiC epilayer and semi-insulating the substrate;
   stripping the aluminum and depositing another layer of aluminum;
   depositing a metallization stack into a trench and on a surface of the substrate;
   depositing a first oxide onto the metallization stack;
   depositing a nickel seed layer on a backside of the metallization stack;
   performing reactive ion etching to etch into the backside to form a diaphragm with a predefined diaphragm thickness;
   creating ohmic contacts in the first oxide;
   depositing ohmic contact metallization and performing self-aligned rapid thermal anneal;
   creating ohmic contact patterns and cleaning the substrate in solvents;
   depositing a second oxide, opening diffusion barrier vias, depositing diffusion barrier metallization, annealing diffusion barrier metallization by blanket rapid thermal anneal, depositing a third oxide layer and annealing;
   creating bond pads vias in the third oxide and cleaning the substrate in acetone;
   depositing bond pad metallization and performing a rapid thermal anneal; and
   using standard photolithography and applying etching to the ohmic contact pattern, and etching pressure sensor bond pads to create the SiC substrate.

2. The method of claim 1, wherein the depositing of the aluminum on the 4H-SiC epilayer further comprising:
   etching, by using standard photolithography, one or more trench patterns in the aluminum.

3. The method of claim 1, wherein the metallization stack comprises of TaSi2 (1 micron)/Pt (5 microns)/TaSi2 (1 micron).

4. The method of claim 1, wherein the depositing of the nickel seed layer further comprising:
   electroplating the nickel to about 10 microns.

5. The method of claim 1, wherein the creating of the ohmic contacts in the oxide by using standard lithography and reactive ion etching.

6. The method of claim 1, wherein the ohmic contact metallization is composed of Ti (100 nm)/TaSi2 (300 nm)/Ti (100 nm)/Pt (300 nm).

7. The method of claim 1, wherein the creating ohmic contact patterns is performed by using standard lithography and reactive ion etching.

8. The method of claim 1, wherein the diffusion barrier metallization is composed of Ti (100 nm)/Pt (300 nm).

9. The method of claim 1, wherein the other layer is composed of Ti (20 nm)/TaSi2 (20 nm)/Pt (100 nm)/Au (1 micron).

10. The method of claim 1, wherein the creating of the bond pads vias is performed by using standard lithography and reactive ion etching in the oxide and cleaning the substrate in acetone.

11. A method for fabricating an integrated pressure sensor and temperature sensor on a single silicon carbide (SiC) substrate, comprising:
    obtaining an n-type 4H-SiC epilayer on semi-insulating 4H-SiC substrate;
    creating piezoresistive patterns and structures in the epilayer;
    growing or depositing silicon dioxide on the patterned piezoresistors;
    depositing a Ti90:Ni10 seed layer on a backside of a wafer; and electroplating nickel to form a mask;
    using nickel as the mask, reactive ion etching the backside of the wafer to form a diaphragm with a predefined diaphragm thickness;
    creating, by using standard lithography and reactive ion etching, ohmic contact vias in an oxide to a SiC surface and cleaning the wafer in piranha clean;
    depositing ohmic contact metallization and performing self-aligned thermal anneal;
    creating ohmic contact patterns and cleaning the wafer in an acetone and isopropanol solvents;
    depositing a second oxide, opening diffusion barrier vias, depositing diffusion barrier metallization, performing blanket rapid thermal anneal diffusion barrier metallization, performing pattern and etch diffusion barrier metallization, and depositing a third oxide layer;
    depositing a metallization stack;
    applying a spin-on-glass (SOG) over wafer and performing curing;
    performing standard photolithography and applying etching to open bond pad vias in the SOG and the third oxide layers;
    depositing a bond pad metallization on the wafer;
    applying standard photolithography and etching to pattern and etch the pressure sensor bond pads; and
    depositing gold followed by pattern and etching to create the SiC substrate.

12. The method of claim 11, wherein the creating of the piezoresistive patterns comprises performing standard lithography and reactive ion etching.

13. The method of claim 11, wherein the depositing of the Ti90:Ni10 seed layer on the backside further comprises electroplating nickel to about 10 microns.

14. The method of claim 11, wherein the reactive ion etching on the backside of the wafer further comprises stripping residual nickel and cleaning the wafer.

15. The method of claim 11, wherein the creating of the ohmic contact vias comprises using standard lithography and reactive ion etching.

16. The method of claim 11, wherein the creating of the ohmic contact patterns further comprises using standard lithography and reactive ion etching.

17. The method of claim 11, wherein the depositing of the metallization stack comprises
patterning the metallization stack, and
performing etching on the metallization stack.

* * * * *